United States Patent [19]

Seely et al.

[11] Patent Number: 5,386,204

[45] Date of Patent: Jan. 31, 1995

[54] HIGH ISOLATION MICROWAVE MODULE

[75] Inventors: Warren L. Seely, Chandler; Joseph H. Kao, Mesa; James H. Fleming, Phoenix, all of Ariz.

[73] Assignee: Motorola, Inc., Schaumburg, Ill.

[21] Appl. No.: 101,165

[22] Filed: Aug. 3, 1993

[51] Int. Cl.⁶ ............................................. H01P 1/208
[52] U.S. Cl. ...................................... 333/208; 333/212
[58] Field of Search ......................... 333/202, 208–212, 333/227–230, 246, 247, 251, 248, 239

[56] References Cited

U.S. PATENT DOCUMENTS

| | | | |
|---|---|---|---|
| 2,585,563 | 2/1952 | Lewis et al. | 333/209 |
| 4,268,803 | 5/1981 | Childs et al. | 333/202 X |
| 4,706,051 | 11/1987 | Dieleman et al. | 333/212 |
| 5,160,903 | 11/1992 | Torkington et al. | 333/12 |

Primary Examiner—Seungsook Ham
Attorney, Agent, or Firm—Jeffrey D. Nehr

[57] ABSTRACT

A high isolation microwave module includes a housing floor with mounting surfaces for placing microwave components and housing walls ending in housing wall ends coupled to and projecting from the housing floor. A lid including a lid plate and lid walls ending in lid wall ends projects from the lid plate. The lid walls extend toward the housing floor and the plurality of housing walls extend toward the lid plate but neither the lid wall ends nor the housing wall ends are coupled to the housing floor or lid plate, respectively. A plurality of cavities exist between the adjacent lid walls between the housing and the lid plate and a plurality of irises exist between immediately adjacent housing walls and corresponding lid walls. The irises and cavities act as a multi-section high pass filter to provide attenuation to a microwave signal passing through the module.

18 Claims, 3 Drawing Sheets

HIGH ISOLATION MICROWAVE MODULE

The U.S. Government has a paid-up license in this invention and the right in limited circumstances to require the patent owner to license others on reasonable terms as provided for by the terms of contract No. DAAB07-91-C-J524 awarded by the U.S. Army.

FIELD OF THE INVENTION

This invention relates in general to the field of the packaging of electronic circuits and in particular to microwave circuit packaging to achieve high isolation between various cavities within a single microwave module.

BACKGROUND OF THE INVENTION

Microwave signals within a partitioned module generally radiate to fill each cavity with some level of microwave energy. The level within an individual cavity is determined by the cavity dimensions, materials, and structures, and to a large extent by the means by which the microwave signal excites the cavity. Careful design methods will minimize but not eliminate these effects. Cavity isolation denotes the extent to which microwave energy arising from one cavity can be minimized in another cavity within the module.

When several separate cavities are required in a partitioned module, and very high levels of cavity-to-cavity isolation are required, special techniques must be implemented since the microwave energy present in one cavity will "leak" over into an adjacent cavity through several mechanisms. Skin effect leakage is easily controlled by proper wall thickness selection. Leakage through via holes can generally be tolerated, but can be minimized by shielding and filters. Leakage through cracks between the lid and the housing comprising the module can be a serious problem, however. Any crack will let energy through in a manner similar to light leaking through cracks in a door jam in a darkened room. Although such leakage is not normally a problem, when high adjacent cavity isolations are required to prevent unwanted noise or oscillation, the solution has typically been to weld, solder, or epoxy the lid in place, thus eliminating the crack through which the energy can leak. Gaskets and spring-loaded fingers have also been used. Each of these methods, however, has serious limitations. Such limitations include difficulty in assembly and removal for rework, as well as utilization of expensive capital equipment and various cleaning methods.

Thus, what is needed is a method and apparatus for high microwave isolation without the need for increased processing and difficult or cumbersome rework procedures. It is also desirable that such a method and apparatus provide high isolation with a simple lid that may be screwed on. It is also desirable that such a method and apparatus allow the housing to be tuned, tweaked, modified, and/or reworked without processing or altering the original housing configuration. An additional desirable feature would be to allow such a housing to be replaced with a metal coated plastic housing, where isolation is very difficult to obtain. The lids in such a case would not have to be conductively attached, but could use any good non-conductive adhesive appropriate for mechanically bonding the lid to the housing.

SUMMARY OF THE INVENTION

Accordingly, it is an advantage of the present invention to provide a new and improved apparatus for providing high microwave isolation in a simple package. It is a further advantage of the present invention that the isolation module effectively attenuates any microwave energy that leaks through small openings between the lid and the housing. The module allows hardware in the housing to be tuned, tweaked, modified, and/or reworked without processing or altering the original housing configuration. The module is suitable for use with metal-coated plastic housings, where isolation is typically very difficult to obtain.

To achieve these advantages, a module for providing high microwave signal isolation is contemplated which includes a housing floor with a plurality of mounting surfaces for placing microwave components and a plurality of housing walls ending in a plurality of housing wall ends coupled to and projecting from the housing floor. A lid including a lid plate and a plurality of lid walls ending in a plurality of lid wall ends projects from the lid plate. The lid and the housing are positioned such that the plurality of lid walls extend from the lid plate toward the housing floor and the plurality of housing walls extend from the housing floor toward the lid plate. Neither the plurality of lid wall ends nor the plurality of housing wall ends are coupled to the housing floor or lid plate, respectively. A plurality of cavities exists in a first plurality of spaces between the adjacent lid walls of the plurality of lid walls between the housing wall ends and the lid plate and a plurality of irises exists comprising a second plurality of spaces between immediately adjacent housing walls of the plurality of housing walls and corresponding lid walls of the plurality of lid walls. The plurality of irises and the plurality of cavities act as a multi-section high pass filter with a cutoff frequency much higher than the signal of interest to provide attenuation to a microwave signal passing through the plurality of irises and the plurality of cavities.

The above and other features and advantages of the present invention will be better understood from the following detailed description taken in conjunction with the accompanying drawings.

DETAILED DESCRIPTION OF THE DRAWINGS

The device contemplated uses a high pass filter structure with a cutoff frequency much higher than the signal of interest created integrally with a lid and a housing such that any energy leaking from a cavity within the lid and housing assembly to the next cavity within the lid and housing assembly is deliberately attenuated. Such a structure can be accomplished by having walls built into the housing as normally designed, except made shorter than housing walls on the edge of the housing that support the lid. The lid can also have walls built into it that extend down on each side of corresponding housing walls when the lid is positioned on the housing, thereby leaving a cavity between the top housing wall and the lid. The small cavity that results functions as a part of a filter, flanked on each side by spacings comprising irises that are the lid wall to housing wall gaps formed by the walls in the cavity and lid. For increased isolation, additional sections of such a filter structure can be added.

Figure 1:
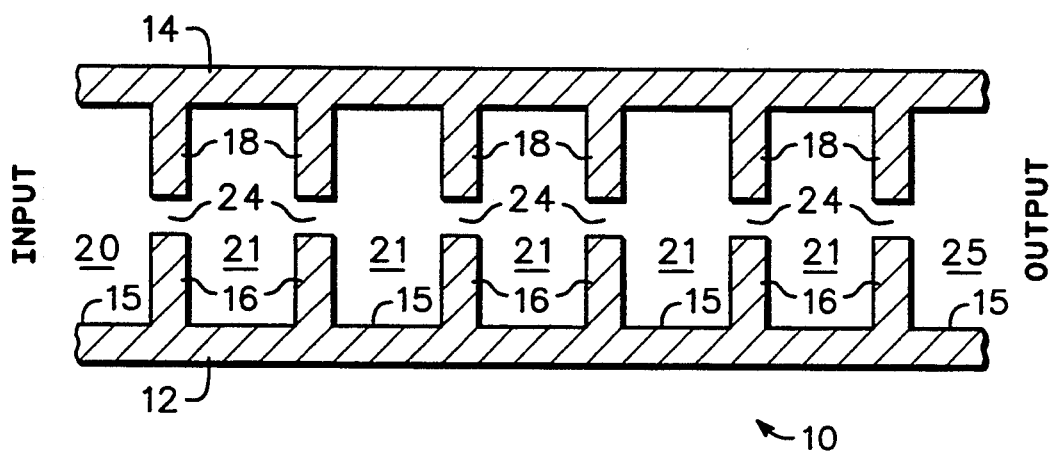
In FIG. 1, them is shown a cross-section of a portion of a lid and housing of a high isolation module analogous to a cavity filter which is prior art.

Specifically, in FIG. 1, there is shown a cross-section of a portion of a lid and housing of a high isolation module analogous to a cavity filter which is prior art. Module 10 in FIG. 1 comprises lid plate 14 and housing 12. Lid plate 14 includes a plurality of lid walls 18 extending away from lid plate 14 and toward housing 12. Lid walls 18 can be oriented substantially perpendicular to lid plate 14. Lid walls 18 may also be made integrally with lid plate 14 such that lid plate 14 and walls 18 are composed of a single material (for example, machined from a single piece of electrically conductive material, such as aluminum or other metal). Housing 12 comprises a plurality of housing walls 16 that extend from the plate portion of housing 12 toward lid plate 14. Housing walls 16 may be substantially perpendicular to the plate portion of housing 12. Housing walls 16 may also be made integrally with the housing 12 and comprised of the same material as housing 12. Housing 12 comprises mounting surfaces 15 on the surface of the housing 12 oriented toward the lid plate 14 between housing walls 16 along the length of housing 12. Mounting surfaces 15 are suitable for mounting components, such as microwave components, to the housing structure.

Lid plate 14 and housing 12 of module 10 are positioned in close proximity in the high isolation packaging module. When lid plate 14 and housing 12 are assembled, a series of cavities 21 are formed between the ends of the lid walls 18 and housing walls 16. In FIG. 1, a series of irises 24 are shown as "entrances" and "exits" to the plurality of cavities 21 throughout the module. An input cavity to module 10 in FIG. 1 is input cavity 20. An output cavity to module 10 in FIG. 1 is output cavity 25.

In function, module 10 in FIG. 1 provides isolation between components mounted on mounting surfaces 15 throughout module 10. For example, any microwave signal present at input cavity 20 that proceeds through the plurality of irises 24 and successive cavities 21 becomes attenuated as if it had passed through a high pass filter with a cutoff frequency well above the signal of interest. Thus, the number of spacings associated with cavities 21 can provide for high microwave signal isolation between cavities 21.

Figure 2:
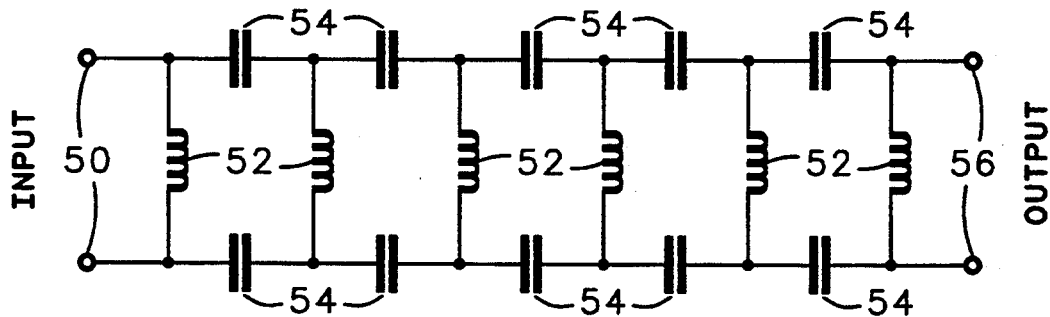
In FIG. 2, them is shown an equivalent circuit for the portion of the lid and housing of the module in FIG. 1.

In FIG. 2, there is shown an equivalent circuit for the portion of the lid and housing of the module in FIG. 1. FIG. 2 illustrates input 50 corresponding to input cavity 20 in FIG. 1. Similarly, a plurality of inductors 52 and capacitors 54 in FIG. 2 are analogous to the plurality of irises 24 and cavities 21, respectively, in FIG. 1. A first terminal of input 50 in FIG. 2 is coupled to the a first terminal of output 56 (which corresponds to output cavity 25 in FIG. 1) through five capacitors 54 in series. Similarly, a second terminal of input 50 is coupled to a second terminal of output 56 through an additional five capacitors 54 in series. The plurality of inductors 52 are coupled one each in parallel across the series connections of capacitors 54 between corresponding capacitors 54 in the two series connections, starting with a parallel connection of an inductor 52 across the two terminals of input 50 and ending with a parallel connection of an inductor 52 coupled across the two terminals of output 56. Thus, parallel capacitors 54 analogous to cavities 21, are coupled via inductors 52 analogous to irises 24. The function of the circuit in FIG. 2 is as a high pass filter between input 50 and output 56, with a cutoff frequency well above the frequency of the signal of interest.

Figure 3:
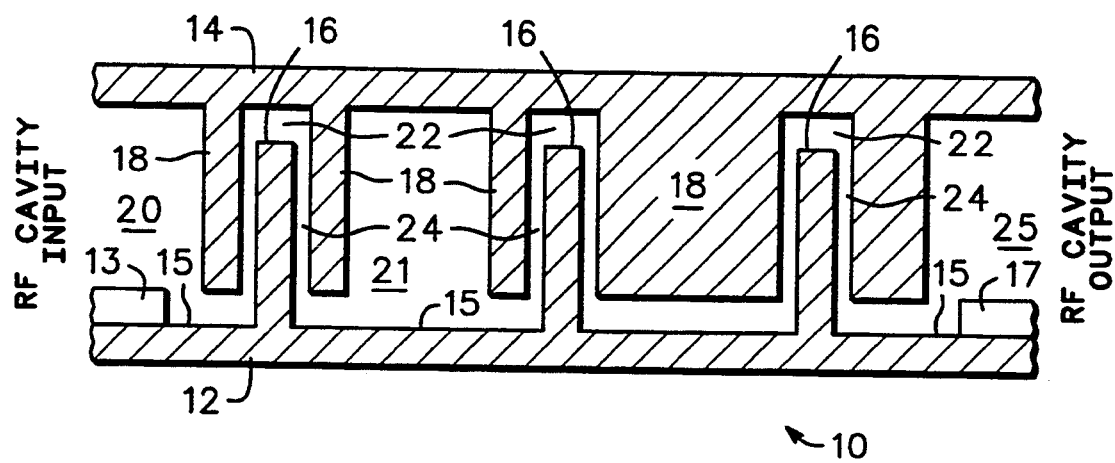
In FIG. 3, them is shown a cross-section of a portion of a lid and housing of a high isolation module in accordance with a first preferred embodiment of the invention.

In FIG. 3, there is shown a cross-section of a portion of a lid and housing of a high isolation module in accordance with a preferred embodiment of the invention. Analogous structures between FIG. 1 and FIG. 3 are illustrated with common reference numerals. Module 10 in FIG. 3 comprises lid plate 14 and housing 12. Housing 12 comprises housing walls 16 that extend away from the plate portion of housing 12 toward lid plate 14. Housing 12 also comprises mounting surfaces 15 on the surface of housing 12 closest to lid plate 14 on which devices such as microwave components can be mounted. Device 13 and device 17 are shown mounted on mounting surfaces 15 within input cavity 20 and output cavity 25, respectively.

Lid plate 14 comprises lid walls 18 extending away from lid plate 14 toward housing 12. The plurality of lid walls 18 corresponds to the plurality of housing walls 16 in the preferred embodiment shown in FIG. 3.

In the module 10 shown in FIG. 3, lid plate 14 is secured in close proximity to housing 12 using fasteners such as screws. Lid walls 18 align on either side of housing walls 16 creating lid wall cavities 22 between adjacent lid walls in the space between the ends of housing walls 16 and the lid plate 14. In addition, irises 24 are formed by the lateral spacing between adjacent lid walls 18 and housing walls 16.

The lid walls 18 in FIG. 3 need not be of uniform width across the module 10 length. The lid walls can be varied in thickness depending on the degree of isolation required within the module 10. In addition, while the lid walls 18 are not shown as extending completely to housing 12 from lid plate 14 nor touching housing walls 16, they may in fact contact housing 12 or housing walls 16 in this preferred embodiment of the invention. In any event, lid walls 18 am not coupled to the housing 12, even if the ends of lid walls 18 are in contact with the housing 12 or if the sides of lid walls 18 are in contact with the housing walls 16.

In tracing the path a microwave signal might take between input cavity 20 and output cavity 25 in FIG. 3, a series of six irises 24, three lid wall cavities 22, and cavity 21 must be traversed. This series of irises 24, lid wall cavities 22, and cavity 21 perform a high pass filter function with a cutoff frequency well above the signal of interest on such a microwave signal. Thus, any devices mounted on mounting surfaces 15, for example, device 13 in input cavity 20 and device 17 in output cavity 25 in FIG. 3, maintain a high degree of microwave signal isolation between one another by virtue of this built-in structural high pass filter configuration.

Figure 4:
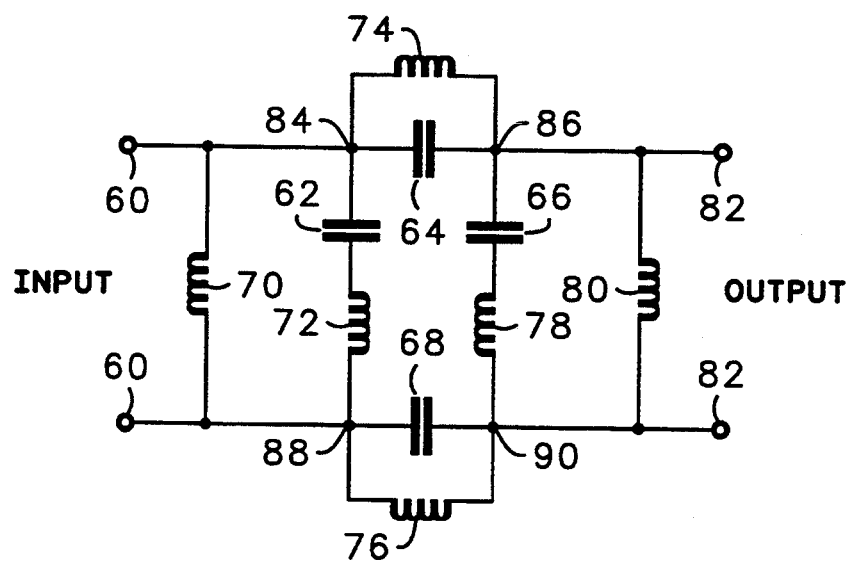
In FIG. 4, there is shown an equivalent circuit for the portion of the lid and housing of the module in FIG. 3; and In FIG. 5, there is shown a lid and housing of a high isolation module in accordance with a second preferred embodiment of the invention.

In FIG. 4, them is shown an equivalent circuit for a portion of the lid and housing of the module shown in FIG. 3. Input 60 in FIG. 4 is analogous to input cavity 20 in FIG. 3. Output 82 in FIG. 4 is analogous to output cavity 25 in FIG. 3. The parallel combination of inductor 74 and capacitor 64 (and of inductor 76 and capacitor 68) is an electrical representation of a resonant cavity. The series combination of inductor 72 and capacitor 62 in parallel with inductor 70 (or of the series combination of inductor 78 and capacitor 66 in parallel with inductor 80) can be viewed as an electrical representation of an iris. The balanced structure of FIG. 4 thus can be viewed as an equivalent circuit for a portion of the FIG. 3 structure. In FIG. 4, a first terminal of input 60 is coupled to node 84. A second terminal of input 60 is coupled to node 88. Inductor 70 is coupled between node 84 and node 88. The series combination of capacitor 62 and inductor 72 is also coupled between node 84 and 88.

Node 84 is coupled to node 86 through capacitor 64 in FIG. 4 as well. Inductor 74 is coupled in parallel between nodes 84 and 86. Similarly, node 86 is coupled to node 90 through the series combination of capacitor 66 and inductor 78. Inductor 80 is coupled in parallel between nodes 86 and 90. Nodes 86 and 90 also comprise the two terminals of output 82 in FIG. 4. Completing the FIG. 4 circuit, capacitor 68 and inductor 76 are coupled in parallel between nodes 88 and 90. The function of FIG. 4 is as the high pass filter with a cutoff frequency well above the signal of interest providing microwave signal isolation between input 60 and output 82.

Figure 5:
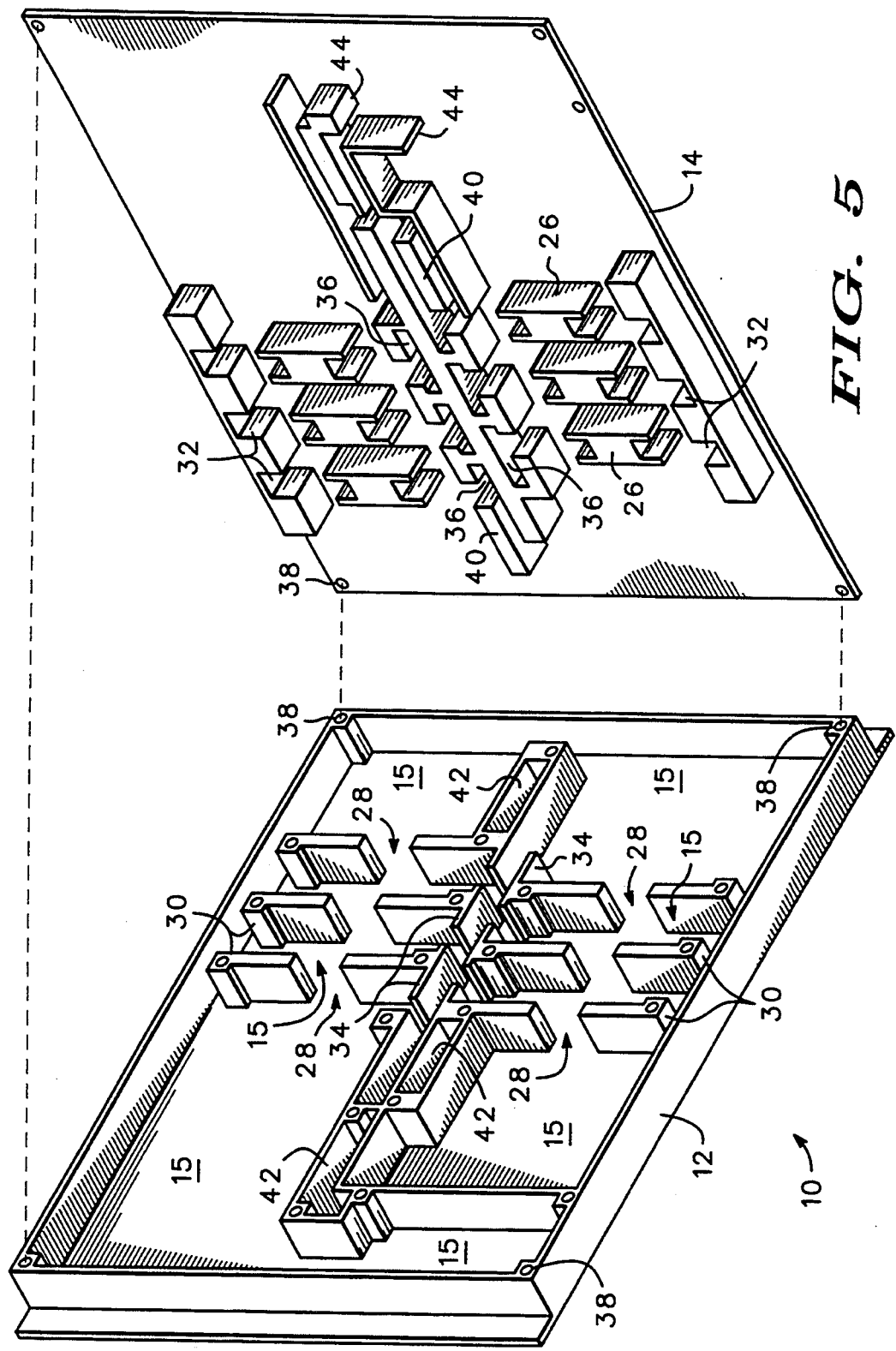

In FIG. 5, there is a shown a lid and housing of a high isolation module in accordance with a second preferred embodiment of the invention. Analogous structures among FIGS. 1,3, and 5 are illustrated with common reference numerals. FIG. 5 illustrates by dashed lines positioning the lid plate 14 assembly onto the housing 12. The FIG. 5 view is of the portions of the housing 12 and the lid plate 14 assemblies that fit together to form the interior isolated structure of module 10.

Module 10 comprises housing 12 and lid plate 14 in FIG. 5. Housing 12 comprises a number of mounting surfaces 15 on which microwave components can be mounted. Mounting surfaces 15 can be separated by center isolation structures 26 (associated with lid plate 14) and isolation structure 30 (associated with housing 12) and corner isolation structure receivers 36 (associated with lid plate 14) and corner isolation structures 34 (associated with housing 12) when lid plate 14 is in the assembled position on housing 12.

In the completed assembly of lid plate 14 and housing 12 in module 10 of FIG. 5, center isolation structure 26 interlaces with center isolation structure receiver 28, end isolation structure 30 interlaces with end isolation structure receiver 32, and corner isolation structures 34 interlaces with corner isolation structure receivers 36 to create an interdigitated assembly. In each of the cases of the center isolation structures, end isolation structures, and corner isolation structures, a portion of each structure wraps around a portion of each corresponding structure receiver forming a cavity and iris arrangement analogous to that shown in FIGS. 1 or 3. The difference with respect to the FIGS. 1 and 3 configurations is that the wrap-around portions comprise wall sections wrapping around other wall sections in a horizontal as well as vertical fashion within the module, rather than lid walls encompassing housing walls in solely a vertical fashion. Regardless, the series of isolation structure/isolation structure receiver combinations form the elements of the high pass filter structure previously described in a two-dimensional fashion.

In function, the multi-section high pass filter arrangement in FIG. 5 is analogous to a wave guide filter. The series of open cavities with small irises between creates a filter with an attenuation cutoff frequency well above the signal of interest. High signal isolation is achieved as long as the cavities and irises are small relative to one-fourth the wave length of the microwave signal in use.

The preferred embodiment in FIG. 5 was used to implement a radio receiver module containing microwave components. The housing 12 and lid plate 14 were comprised of aluminum which was tin plated. Included in the receiver module were IF amplifiers, dielectric resonator oscillator and voltage regulator printed wiring boards, along with mixers, limiters, detectors, and filters, which were installed on mounting surface 15 along with the printed wiring boards using conductive epoxies.

Thus, a high isolation microwave module method and apparatus has been described which overcomes specific problems and accomplishes certain advantages relative to prior art methods and mechanisms. The improvements over known technology are significant. The preferred embodiments described above provide high isolation between various cavities within a single microwave module without resorting to welding, soldering, or conductive epoxying. The preferred embodiments are relatively easy to assembly and components are relatively easy to remove, simplifying rework. The methods contemplated eliminate the need for specialized processing which utilize expensive capital equipment and chemical cleaning methods. The new method and apparatus described can provide high isolation with a simple screw-on lid. Hardware in the housing may be tuned, tweaked, modified, and reworked without processing or altering the original housing configuration. In addition, the above techniques can extend to using metal coated plastic housings where isolation is very difficult to obtain. The lid in such a case need not be conductively attached, but can be affixed using any non-conductive adhesive appropriate for mechanically bonding parts together.

Thus, there has also been provided, in accordance with an embodiment of the invention, a method and apparatus for a high isolation microwave module that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations that fall within the spirit and broad scope of the appended claims.

What is claimed is:

1. A module for providing high microwave signal isolation, the module comprising:
   a housing including a housing floor with a plurality of mounting surfaces for placing microwave components and a plurality of housing walls ending in a plurality of housing wall ends coupled to and projecting from the housing floor; and
   a lid including a lid plate and a plurality of lid walls ending in a plurality of lid wall ends projecting from the lid plate; wherein the lid and the housing are positioned such that the plurality of lid walls extend from the lid plate toward the housing floor and the plurality of housing walls extend from the housing floor toward the lid plate, but neither the plurality of lid wall ends nor the plurality of housing wall ends are coupled to the housing floor or lid plate, respectively, and a plurality of cavities exist in a first plurality of spaces between the adjacent lid walls of the plurality of lid walls between the housing and the lid plate and a plurality of irises exist comprising a second plurality of spaces between immediately adjacent housing walls of the plurality of housing walls and corresponding lid walls of the plurality of lid walls, the plurality of irises and the plurality of cavities providing attenuation to a microwave signal passing through the plurality of irises and the plurality of cavities.

2. A module for providing high microwave isolation as claimed in claim 1, wherein the housing walls are integral with the housing plate and the lid walls are integral with the lid plate.

3. A module for providing high microwave isolation as claimed in claim 1, wherein the plurality of lid walls and the plurality of housing walls do not contact the housing floor and lid plate, respectively.

4. A module for providing high microwave isolation as claimed in claim 1, wherein the lid walls are substantially perpendicular to the lid plate and the housing walls are substantially perpendicular to the housing plate.

5. A module for providing high microwave isolation as claimed in claim 3, wherein the housing and lid are comprised of electrically conductive material.

6. A module for providing high microwave isolation as claimed in claim 3, wherein the housing and lid are comprised of metal-coated plastic.

7. A module for providing high microwave isolation as claimed in claim 6, wherein the lid is secured to the housing with a non-electrically conductive adhesive.

8. A module for providing high microwave isolation as claimed in claim 5, wherein the lid and housing are structurally coupled using fasteners.

9. A module for providing high microwave isolation as claimed in claim 5, wherein a plurality of microwave components are mounted on a plurality of component-mounting surfaces located on the housing between adjacent housing walls of the plurality of housing walls.

10. A radio module for providing high microwave signal isolation, the module comprising:
a housing including a housing floor with a plurality of mounting surfaces for placing microwave components and a plurality of housing walls ending in a plurality of housing wall ends coupled to and projecting from the housing floor; and
a lid including a lid plate and a plurality of lid walls ending in a plurality of lid wall ends projecting from the lid plate, wherein the lid and the housing are positioned such that the plurality of lid walls extend from the lid plate toward the housing floor and the plurality of housing walls extend from the housing floor toward the lid plate, but neither the plurality of lid wall ends nor the plurality of housing wall ends are coupled to the housing floor or lid plate, respectively, and a plurality of cavities exist in a first plurality of spaces between the adjacent lid walls of the plurality of lid walls between the housing and the lid plate and a plurality of irises exist comprising a second plurality of spaces between immediately adjacent housing walls of the plurality of housing walls and corresponding lid walls of the plurality of lid walls, the plurality of irises and the plurality of cavities providing attenuation to a microwave signal passing through the plurality of irises and the plurality of cavities.

11. A radio module as claimed in claim 10, wherein the housing walls are integral with the housing plate and the lid walls are integral with the lid plate.

12. A radio module as claimed in claim 10, wherein the plurality of lid walls and the plurality of housing walls do not contact the housing floor and lid plate, respectively.

13. A radio module as claimed in claim 10, wherein the lid walls are substantially perpendicular to the lid plate and the housing walls are substantially perpendicular to the housing plate.

14. A radio module as claimed in claim 12, wherein the housing and lid are comprised of electrically conductive material.

15. A radio module as claimed in claim 12, wherein the housing and lid are comprised of metal-coated plastic.

16. A radio module as claimed in claim 15, wherein the lid is secured to the housing with a non-electrically conductive adhesive.

17. A radio module as claimed in claim 14, wherein the lid and housing are structurally coupled using fasteners.

18. A radio module as claimed in claim 14, wherein a plurality of microwave components are mounted on a plurality of component-mounting surfaces located on the housing between adjacent housing walls of the plurality of housing walls.

* * * * *